United States Patent
Kang et al.

(10) Patent No.: US 9,542,747 B2
(45) Date of Patent: Jan. 10, 2017

(54) ASSEMBLY SIMULATION APPARATUS AND METHOD FOR WOODEN STRUCTURE

(71) Applicant: ELECTRONICS AND TELECOMMUNICATIONS RESEARCH INSTITUTE, Daejeon (KR)

(72) Inventors: Kyung-Kyu Kang, Seoul (KR); Jin-Seo Kim, Daejeon (KR); Ji-Hyung Lee, Daejeon (KR); Soon-Young Kwon, Daejeon (KR); Song-Woo Lee, Daejeon (KR); Jae-Woo Kim, Daejeon (KR); Ju-Yeon You, Daejeon (KR); In-Su Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 36 days.

(21) Appl. No.: 14/565,487

(22) Filed: Dec. 10, 2014

(65) Prior Publication Data
US 2015/0138194 A1    May 21, 2015

(30) Foreign Application Priority Data

Jan. 7, 2014 (KR) ........................ 10-2014-0001773

(51) Int. Cl.
*G06T 13/00* (2011.01)
*G06T 7/00* (2006.01)
*G06F 17/50* (2006.01)

(52) U.S. Cl.
CPC ......... *G06T 7/0051* (2013.01); *G06F 17/5004* (2013.01); *G06F 17/5009* (2013.01); *G06F 17/5086* (2013.01); *G06T 13/00* (2013.01)

(58) Field of Classification Search
None
See application file for complete search history.

(56) References Cited

U.S. PATENT DOCUMENTS 7,075,531 B1 * 7/2006 Ando .................. G06T 13/80
                                              345/420
8,027,745 B1 * 9/2011 Freeze ................. G06Q 10/06
                                              700/106
(Continued)

FOREIGN PATENT DOCUMENTS

| KR | 10-2000-0058784 A | 10/2000 |
| KR | 10-2009-0125272 A | 12/2009 |
| KR | 10-1179492 B1 | 9/2012 |

OTHER PUBLICATIONS

Wilmot Li et al., "Automated Generation of Interactive 3D Exploded View Diagrams," ACM Transactions on Graphics, 2008.

*Primary Examiner* — Ryan M Gray
(74) *Attorney, Agent, or Firm* — LRK Patent LawFirm

(57) ABSTRACT

An assembly simulation apparatus and method for a wooden structure are provided. The assembly simulation apparatus for a wooden structure includes an element analysis unit for analyzing shapes of a plurality of elements constituting a three-dimensional (3D) wooden structure model and a coupling relation between the elements. A relation graph generation unit generates a relation graph based on the analyzed shapes of the plurality of elements and the analyzed coupling relation between the elements. An animation creation unit creates an animation of a movement path depending on a task for coupling or separating the plurality of elements, based on the generated relation graph. An animation play unit simulates an assembly method for the wooden structure by playing the created animation depending on the assembly method for the wooden structure.

10 Claims, 7 Drawing Sheets

(56) References Cited

U.S. PATENT DOCUMENTS

| | | | |
|---|---|---|---|
| 8,374,829 B2 | 2/2013 | Jakobsen et al. | |
| 2005/0237322 A1* | 10/2005 | Minami | G06T 13/20 345/419 |
| 2008/0228450 A1* | 9/2008 | Jakobsen | G06T 17/10 703/2 |
| 2009/0153587 A1 | 6/2009 | Kang et al. | |
| 2011/0179624 A1* | 7/2011 | Sexton | A47B 97/00 29/428 |
| 2012/0100520 A1* | 4/2012 | Jo | G09B 25/00 434/365 |
| 2012/0130521 A1* | 5/2012 | Kohlhoff | G06T 19/00 700/98 |
| 2014/0118358 A1* | 5/2014 | Enomoto | G06T 13/20 345/473 |
| 2014/0129185 A1 | 5/2014 | Ahn et al. | |

\* cited by examiner

| NODE NO. |
|---|
| PARENT NODE NO. |
| RELATIVE LOCATION TO PARENT NODE (DISTANCE, ANGLE) |
| ELEMENT SHAPE NO. |
| BOUNDING BOX |
| NEIGHBORING NODE NO. |

FIG. 4

ASSEMBLY SIMULATION APPARATUS AND METHOD FOR WOODEN STRUCTURE

CROSS REFERENCE TO RELATED APPLICATION

This application claims the benefit of Korean Patent Application No. 10-2014-0001773, filed Jan. 7, 2014, which is hereby incorporated by reference in its entirety into this application.

BACKGROUND OF THE INVENTION

1. Technical Field

The present invention relates generally to an assembly simulation apparatus and method for a wooden structure and, more particularly, to a scheme that simulates an assembly method from elements constituting a Korean traditional wooden structure in a three-dimensional (3D) virtual environment, and creates and plays an animation of an assembly completion process.

2. Description of the Related Art

Traditionally, methods of assembling a Korean traditional wooden structure have been verbally handed down by carpenters to their apprentices.

Recently, as software technology has developed, a process for designing and constructing buildings or structures has begun to be documented using a computer. In order to show a construction process using a computer simulation, a simulation creator must spend a lot of time and effort to create the simulation using graphic content software. However, in the case of a simulation created in this way, there is a problem in that the results of a simulation are very simple and only an assembly sequence is shown, and thus the utilization of the simulation is low. In particular, since a Korean traditional wooden structure is built in various manners without using an adhesive or nails, it is important to automatically create and show a high-quality simulation in conformity with a traditional construction scheme.

In relation to this, Korean Patent Application Publication No. 2000-0058784 discloses technology entitled "Method for creating simulation related to architecture interior design and performing customization based on the simulation."

SUMMARY OF THE INVENTION

Accordingly, the present invention has been made keeping in mind the above problems occurring in the prior art, and an object of the present invention is to provide an assembly simulation apparatus and method for a wooden structure, which simulate in a 3D manner a procedure for assembling elements constituting the entirety or part of a traditional wooden structure into a completed structure based on an actual traditional assembly scheme.

In accordance with an aspect of the present invention, there is provided an assembly simulation apparatus for a wooden structure, including an element analysis unit for analyzing shapes of a plurality of elements constituting a three-dimensional (3D) wooden structure model and a coupling relation between the elements; a relation graph generation unit for generating a relation graph based on the analyzed shapes of the plurality of elements and the analyzed coupling relation between the elements; an animation creation unit for creating an animation of a movement path depending on a task for coupling or separating the plurality of elements, based on the generated relation graph; and an animation play unit for simulating an assembly method for the wooden structure by playing the created animation depending on the assembly method for the wooden structure.

The assembly simulation apparatus may further include an element information database (DB) for storing data structures including shape information of a plurality of elements and assembly method information for each wooden structure formed by the plurality of elements.

The shape information may include at least one of element name information, element type information, shape definition information, and assembly method identification number information, The assembly method information may include at least one of assembly method name information, assembly classification information, and assembly procedure information that correspond to the assembly method identification number.

The element analysis unit may determine whether the shapes of the plurality of elements constituting the 3D wooden structure are identical to pieces of shape information stored in an element information DB.

The relation graph generation unit may generate the relation graph based on a data structure including information required to define a coupling relation between a certain element selected by a user and a neighboring element thereof, wherein the required information includes at least one of parent node number information, relative location information to the parent node, shape information, bounding box information, and neighboring node number information of the certain element.

The parent node may be a parent element that has already been assembled and that functions as a parent, and the neighboring node may be a neighboring element that is assembled to the parent node simultaneously with the certain element.

The relative location information to the parent node may be information about a distance and an angle between the certain element and the parent node of the certain element.

The animation creation unit may implement location transformation and rotational transformation of a certain element selected by a user as a keyframe animation.

In accordance with another aspect of the present invention, there is provided an assembly simulation method for a wooden structure, including analyzing, by an element analysis unit, shapes of a plurality of elements constituting a three-dimensional (3D) wooden structure model and a coupling relation between the elements; generating, by a relation graph generation unit, a relation graph based on the analyzed shapes of the plurality of elements and the analyzed coupling relation between the elements; creating, by an animation creation unit, an animation of a movement path depending on a task for coupling or separating the plurality of elements, based on the generated relation graph; and simulating, by an animation play unit, an assembly method for the wooden structure by playing the created animation depending on the assembly method for the wooden structure.

Analyzing the shapes of the plurality of elements constituting the 3D wooden structure model and the coupling relation between the elements may include determining whether the shapes of the plurality of elements constituting the 3D wooden structure are identical to pieces of shape information stored in an element information DB.

Generating the relation graph based on the analyzed shapes of the plurality of elements and the analyzed coupling relation between the elements may include generating the relation graph based on a data structure including information required to define a coupling relation between a certain element selected by a user and a neighboring element thereof, wherein the required information includes at least one of parent node number information, relative location information to the parent node, shape information, bounding box information, and neighboring node number information of the certain element.

Creating the animation of the movement path depending on the task for coupling or separating the plurality of elements may include implementing location transformation and rotational transformation of a certain element selected by a user as a keyframe animation.

BRIEF DESCRIPTION OF THE DRAWINGS

The above and other objects, features and advantages of the present invention will be more clearly understood from the following detailed description taken in conjunction with the accompanying drawings, in which:

FIG. 4 is a diagram showing the data structure of a relation graph generated by a relation graph generation unit employed in the assembly simulation apparatus for a wooden structure according to the present invention;

DESCRIPTION OF THE PREFERRED EMBODIMENTS

Figure 1:
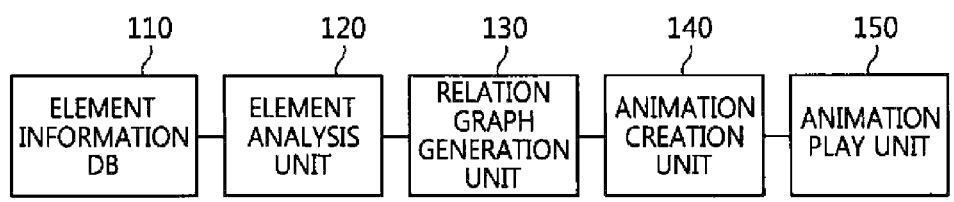
FIG. 1 is a diagram showing the configuration of an assembly simulation apparatus for a wooden structure according to the present invention.

Embodiments of the present invention are described with reference to the accompanying drawings in order to describe the present invention in detail so that those having ordinary knowledge in the technical field to which the present invention pertains can easily practice the present invention. It should be noted that the same reference numerals are used to designate the same or similar elements throughout the drawings. In the following description of the present invention, detailed descriptions of known functions and configurations which are deemed to make the gist of the present invention obscure will be omitted.

Hereinafter, an assembly simulation apparatus and method for a wooden structure according to embodiments of the present invention will be described in detail with reference to the attached drawings.

Figure 2A:
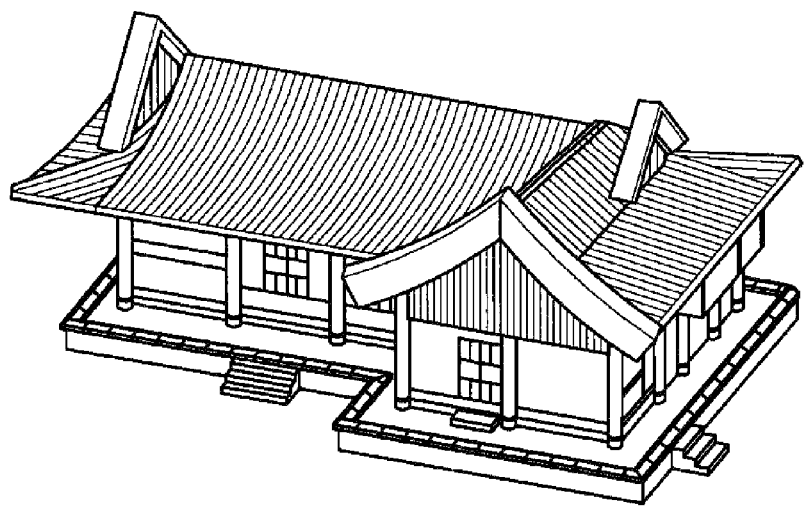
FIG. 2A is a diagram showing a 3D wooden structure model applied to the assembly simulation apparatus for a wooden structure according to the present invention.
Figure 2B:
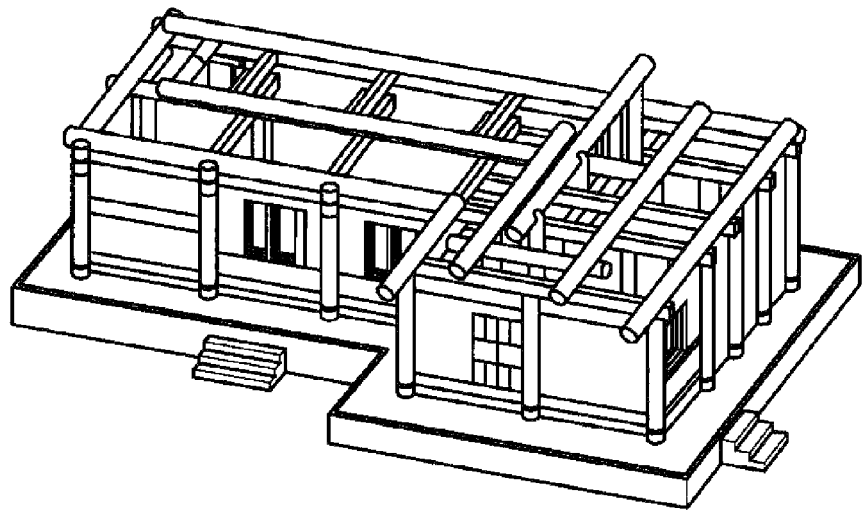
FIG. 2B is a diagram showing the shapes of internal elements of a wooden structure applied to the assembly simulation apparatus for a wooden structure according to the present invention.

FIG. 1 is a diagram showing the configuration of an assembly simulation apparatus for a wooden structure according to the present invention, FIG. 2A is a diagram showing a 3D wooden structure model applied to the assembly simulation apparatus for a wooden structure according to the present invention, and FIG. 2B is a diagram showing the shapes of internal elements of a wooden structure applied to the assembly simulation apparatus for a wooden structure according to the present invention.

Referring to FIG. 1, an assembly simulation apparatus 100 for a wooden structure according to the present invention includes an element information DB 110, an element analysis unit 120, a relation graph generation unit 130, an animation creation unit 140, and an animation play unit 150.

The element information DB 110 stores data structures including shape information of a plurality of elements and assembly method information for each wooden structure formed by the plurality of elements. The shape information is a data structure for defining the geometric structural characteristics of joint parts via classification of the joint parts based on the shapes thereof in an assembly method. The assembly method information is a data structure for classifying assembly methods for wooden structures and describing procedures for assembly between individual elements. The element information DB 110 stores the information of animation ranging from the time before elements are assembled to the time at which assembly is completed.

The element analysis unit 120 analyzes the shapes of each 3D wooden structure model, such as that shown in FIG. 2A, and a plurality of elements constituting the 3D wooden structure model, such as those shown in FIG. 2B, and a coupling relation between the elements. The element analysis unit 120 determines whether the shapes of the plurality of elements constituting the 3D wooden structure are identical to pieces of shape information stored in the element information DB 110, and generates a bounding box that is to be used to perform collision processing and to search for a parent element and a neighboring element upon subsequently playing an animation.

The relation graph generation unit 130 generates a relation graph based on the shapes of the plurality of elements and the coupling relation between the elements, which have been analyzed. That is, the relation graph generation unit 130 is a data structure for defining a relation between a specific element and other elements assembled adjacent to the specific element. In the graph, each node denotes a single element and a root node denotes an element to be first assembled. From the same concept, a parent node means that it must be assembled earlier than a child node.

The animation creation unit 140 creates an animation of a movement path of the plurality of elements depending on tasks for coupling or separating the plurality of elements, based on the generated relation graph. The animation creation unit 140 creates a path along which a certain element selected by a user is moved from the outside into an assembly environment so that the certain element is assembled. Such a movement path is implemented as a keyframe animation of location transformation and rotational transformation required to move to a location suitable for assembly without colliding with preassembled elements or other obstacles.

The animation play unit 150 plays the created animation depending on the assembly method for the wooden structure, thus simulating the assembly method, The animation play unit 150 plays an animation moving along the created movement path. That is, when a certain element is placed at a location suitable for assembly, the element information DB 110 plays the animation based on the assembly method information.

Figure 3:
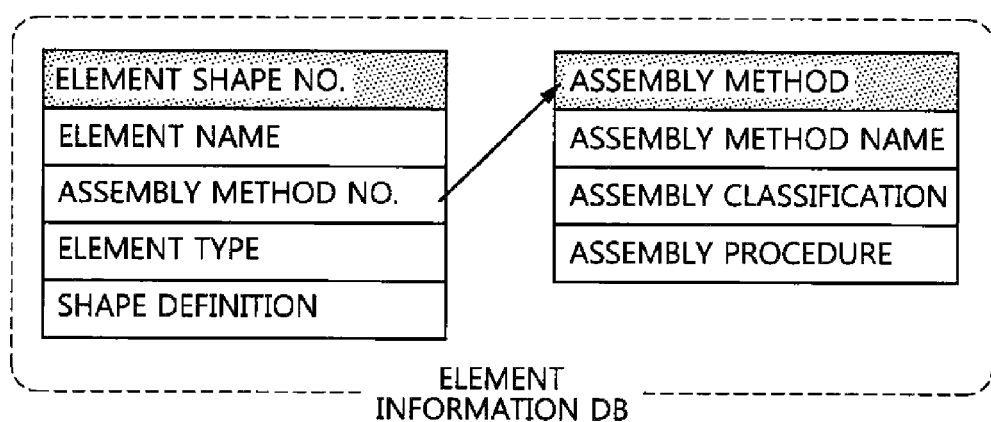
FIG. 3 is a diagram showing the data structure of an element information database (DB) employed in the assembly simulation apparatus for a wooden structure according to the present invention.

FIG. 3 is a diagram showing the data structure of an element information DB employed in the assembly simulation apparatus for a wooden structure according to the present invention.

Referring to FIG. 3, the element information DB 110 according to the present invention stores data structures including the shape information of a plurality of elements and assembly method information for each wooden structure formed by the plurality of elements.

The shape information includes at least one of element name information, element type information, shape definition information, and assembly method identification number (No.) information. The assembly method information includes at least one of assembly method name information, assembly classification information, and assembly procedure information that correspond to the assembly method identification number.

Figure 5A:
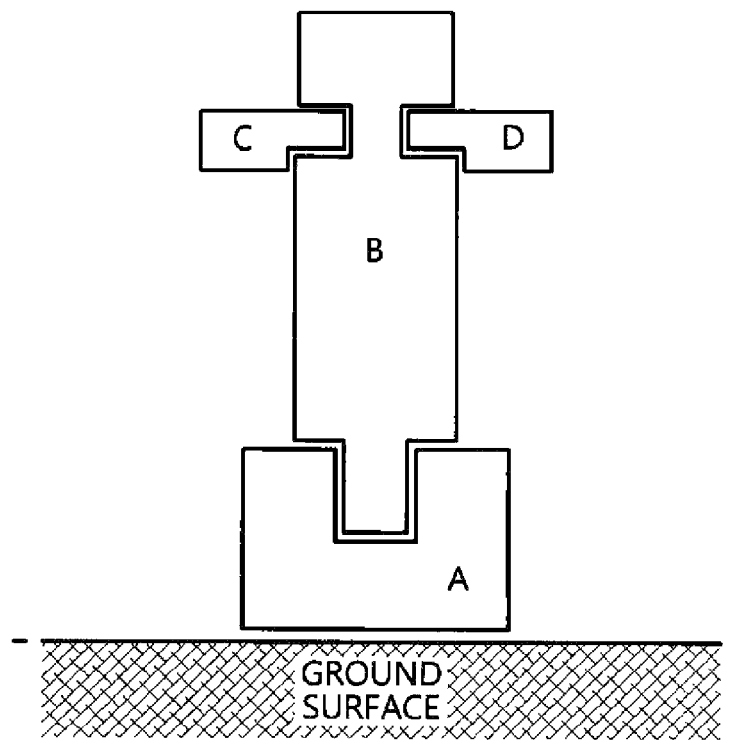
FIG. 5A is a sectional view of a structure applied to the assembly simulation apparatus for a wooden structure according to the present invention.
Figure 5B:
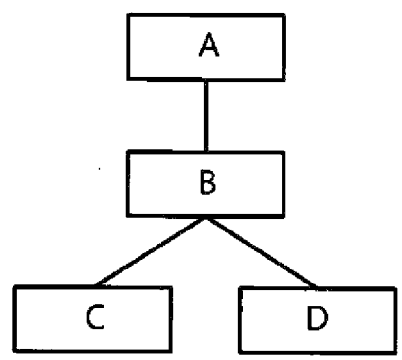
FIG. 5B is a diagram showing a relation graph simplified based on the sectional view of FIG. 5A.

FIG. 4 is a diagram showing the data structure of a relation graph generated by the relation graph generation unit employed in the assembly simulation apparatus for a wooden structure according to the present invention, FIG. 5A is a sectional view of a structure applied to the assembly simulation apparatus for a wooden structure according to the present invention, and FIG. 5B is a diagram showing a relation graph simplified based on the sectional view of FIG. 5A.

Referring to FIG. 4, the relation graph generation unit 130 according to the present invention generates a relation graph based on the shapes of a plurality of elements and a coupling relation between the elements.

The relation graph generation unit 130 generates a relation graph based on a data structure including information required to define a coupling relation between a certain element selected by the user and neighboring elements thereof, wherein the required information includes at least one of the parent node (element) number information, relative location information to the parent node, shape information, bounding box information, and neighboring node number information of the certain element.

In the generated relation graph, a root node denotes an element to be first assembled, and "A" shown in FIGS. 5A and 5B denotes the root node.

Figure 6:
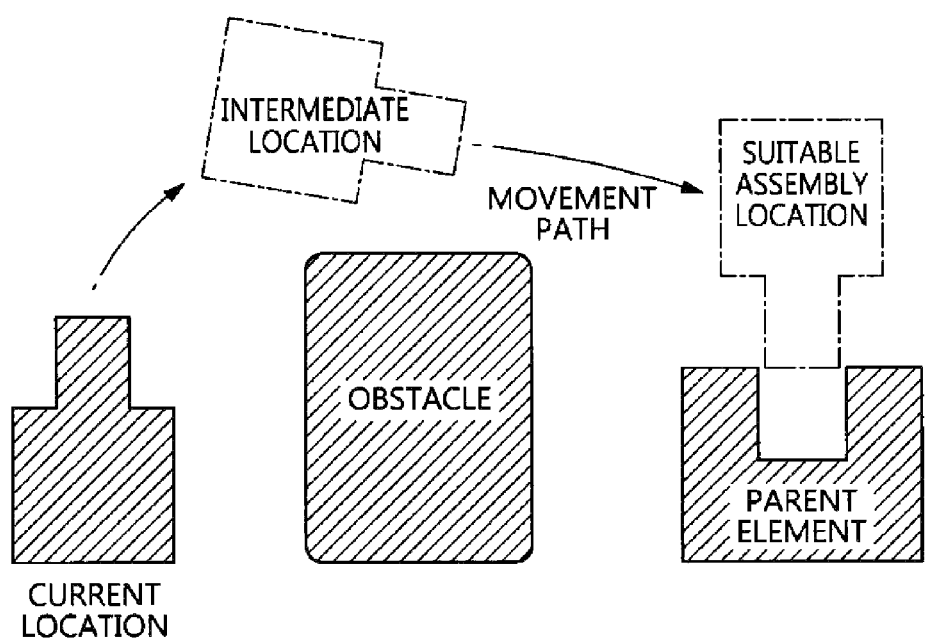
FIG. 6 is a diagram showing a procedure for creating an element movement path in an animation creation unit employed in the assembly simulation apparatus for a wooden structure according to the present invention.

FIG. 6 is a diagram showing a procedure for creating an element movement path in the animation creation unit employed in the assembly simulation apparatus for a wooden structure according to the present invention.

Referring to FIG. 6, the animation creation unit 140 according to the present invention creates an animation of a movement path, based on a task for coupling or separating a plurality of elements based on the generated relation graph. When the user selects a certain element, the animation creation unit 140 creates an animation based on the movement path in which the certain element is coupled to a parent element. In this case, since the parent element of the certain element must already be completed, an animation in which the parent element is assembled must also be created simultaneously with the completion of the parent element. Further, when a certain element that has already been assembled is selected, an animation in which child elements are separated must also be created.

Figure 7:
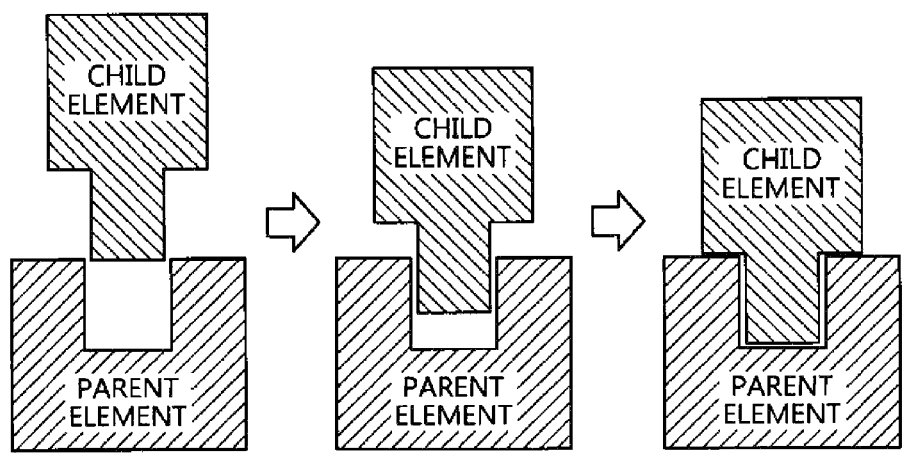
FIG. 7 is a diagram showing a procedure for playing an assembly method in an animation play unit employed in the assembly simulation apparatus for a wooden structure according to the present invention.

FIG. 7 is a diagram showing a procedure for playing an assembly method in the animation play unit employed in the assembly simulation apparatus for a wooden structure according to the present invention.

Referring to FIG. 7, the animation play unit 150 according to the present invention simulates an assembly method for a wooden structure by playing the created animation depending on the assembly sequence. When an element selected by the user is placed at a location suitable for assembly, an assembly animation for the corresponding element is played based on the assembly method stored in the element information DB 110. In this case, examination of collision detection of a bounding box is also performed while the corresponding element is moving. If the corresponding element cannot be moved along the created movement path, the animation play unit 150 requests a new path as a bypass path from the animation creation unit 140.

Figure 8:
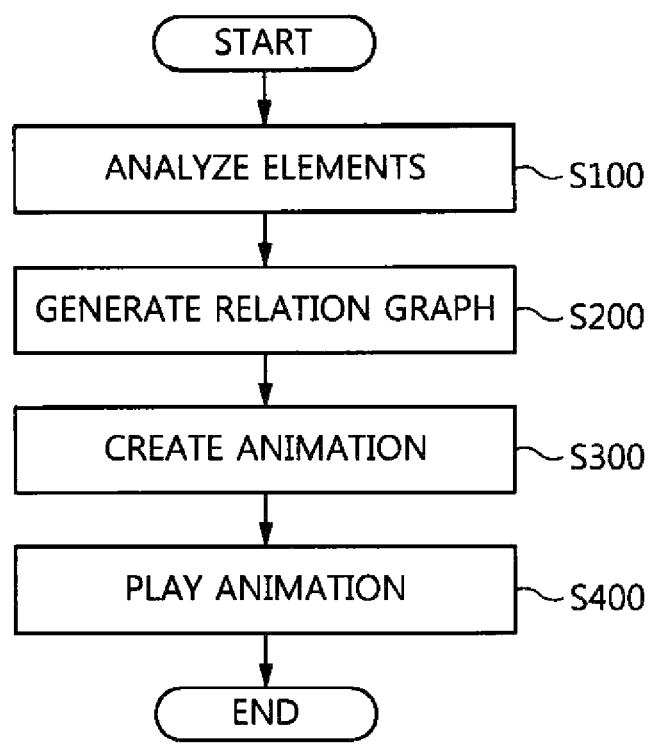
FIG. 8 is a flowchart showing the sequence of an assembly simulation method for a wooden structure according to the present invention.

FIG. 8 is a flowchart showing the sequence of an assembly simulation method for a wooden structure according to the present invention.

Referring to FIG. 8, the assembly simulation method for a wooden structure according to the present invention is based on the above-described assembly simulation apparatus for the wooden structure, and repeated descriptions thereof will be omitted.

First, the shapes of a 3D wooden structure model and a plurality of elements constituting the 3D wooden structure model and a coupling relation between the elements are analyzed at step S100. At step S100, it is determined whether the shapes of the plurality of elements constituting the 3D wooden structure model are identical to pieces of shape information stored in the element information DB, and a bounding box is generated which is to be used to perform collision processing and to search for a parent element and a neighboring element upon subsequently playing an animation is generated.

Then, a relation graph is generated based on the shapes of the plurality of elements and the coupling relation between the elements, which have been analyzed above, at step S200.

Next, an animation of a movement path depending on a task for coupling or separating a plurality of elements is created based on the generated relation graph at step S300. Step S300 is configured to create a path along which a certain element selected by the user is moved from the outside into an assembly environment so that the element is assembled. Such a movement path is implemented as a keyframe animation of location transformation and rotational transformation required to move to a location suitable for assembly without colliding with preassembled elements or other obstacles.

Thereafter, the assembly method for the wooden structure is simulated by playing the animation of the wooden structure assembly method at step S400. At step S400, when the corresponding element is placed at a location suitable for assembly, the animation is played based on the assembly method information stored in the element information DB.

In this way, the assembly simulation apparatus and method for a wooden structure according to the present invention, having the above-described configuration, are advantageous in that a construction process for assembling elements constituting the entirety or part of a traditional wooden structure into a completed structure can be simulated in a 3D manner, based on an actual traditional assembly scheme, thus allowing users to have a virtual assembly experience, and constructors to verify an assembly plan.

As described above, although optimal embodiments of the present invention have been disclosed, the present invention may be changed and modified in various forms. It is understood that those skilled in the art will practice various modifications and changes without departing from the spirit and scope of the accompanying claims of the present invention.

What is claimed is:

1. An assembly simulation apparatus for demonstrating a three-dimensional (3D) wooden structure model, comprising:
    a server comprising one or more units, executed by a processor, using algorithm, which when executed, causes the processor to perform the one or more units, the units comprising,
    an element analysis unit for analyzing shapes of a plurality of elements and a coupling relation of the elements associated with an assembly method of the elements, wherein a non-transitory database (DB) is configured to store data structures including shape information of the plurality of elements and information of the assembly method with respect to each wooden structure plurality by the plurality of elements,
    in response to receipt of the analysis of the shapes of a plurality of elements and a coupling relation of the elements,
    the element analysis unit further configured to determine whether the shapes of the plurality of elements which being analyzed are identical to pieces of shape information stored in the DB;
    a relation graph generation unit for generating a relation graph based on the analyzed shapes of the plurality of elements and the analyzed coupling relation between the elements;
    an animation creation unit for creating an animation of a movement path associated with coupling or separating the plurality of elements based on the generated relation graph, the relation graph defining a structural relation between a first element and other elements assembled adjacent to the first element; and
    an animation play unit for simulating an assembly method by displaying the created animation depending on the assembly method for the three-dimensional (3D) wooden structure.

2. The assembly simulation apparatus of claim 1, wherein the shape information includes at least one of element name information, element type information, shape definition information, and assembly method identification number information.

3. The assembly simulation apparatus of claim 2, wherein the assembly method information includes at least one of assembly method name information, assembly classification information, and assembly procedure information that correspond to the assembly method identification number.

4. The assembly simulation apparatus of claim 1, wherein the relation graph generation unit generates the relation graph based on a data structure including information required to define a coupling relation between an element selected by a user and a neighboring element thereof, wherein
    the required information to define the coupling relation includes, at least one of parent node, relative location information to the parent node, shape information, bounding box information, and neighboring node number information of the element.

5. The assembly simulation apparatus of claim 4, wherein the parent node is a parent element that has already having been assembled and that functions as a parent, and the neighboring node is a neighboring element that is simultaneously assembled to the parent node with the element.

6. The assembly simulation apparatus of claim 4, wherein the relative location information to the parent node is information about a distance and an angle between the element and the parent node.

7. The assembly simulation apparatus of claim 1, wherein the animation creation unit implements location transformation and rotational transformation of an element using a keyframe animation.

8. A computer-implemented assembly simulation method for demonstrating a three-dimensional (3D) wooden structure model, comprising:
    analyzing, by a processor, shapes of a plurality of elements and a coupling relation of the elements associated with an assembly method of the elements, wherein a non-transitory database (DB) is configured to store data structures including shape information of the plurality of elements and information of the assembly method with respect to each wooden structure formed by the plurality of elements,
    upon receiving analysis of the shapes of a plurality of elements and a coupling relation of the elements,
    determining, by the processor, whether the shapes of the plurality of elements which being analyzed are identical to pieces of shape information stored in the DB;
    generating a relation graph based on the analyzed shapes of the plurality of elements and the analyzed coupling relation between the elements, the relation graph defining a structural relation between a first element and other elements assembled adjacent to the first element;
    creating an animation of a movement path associated with coupling or separating the plurality of elements based on the generated relation graph; and
    simulating an assembly method by displaying the created animation depending on the assembly method for the three-dimensional (3D) wooden structure.

9. The assembly simulation method of claim 8, wherein generating the relation graph based on the analyzed shapes of the plurality of elements and the analyzed coupling relation between the elements comprises generating the relation graph based on a data structure including information required to define a coupling relation between an element selected by a user and a neighboring element thereof, wherein
    the required information includes at least one of parent node number information, relative location information to the parent node, shape information, bounding box information, and neighboring node number information of the element.

10. The assembly simulation method of claim 8, wherein creating the animation of the movement path depending on the task for coupling or separating the plurality of elements comprises implementing location transformation and rotational transformation of an element selected by a user using a keyframe animation.

* * * * *